US011417452B2

(12) United States Patent
Ikegaya et al.

(10) Patent No.: US 11,417,452 B2
(45) Date of Patent: Aug. 16, 2022

(54) ELECTRONIC CONTROL UNIT

(71) Applicant: Hitachi Automotive Systems, Ltd., Hitachinaka (JP)

(72) Inventors: Katsumi Ikegaya, Hitachinaka (JP); Keishi Komoriyama, Hitachinaka (JP); Yoshiaki Mizuhashi, Hitachinaka (JP); Takayuki Oshima, Hitachinaka (JP); Shinichirou Wada, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 376 days.

(21) Appl. No.: 16/624,415

(22) PCT Filed: Apr. 19, 2018

(86) PCT No.: PCT/JP2018/016085
§ 371 (c)(1),
(2) Date: Dec. 19, 2019

(87) PCT Pub. No.: WO2019/012777
PCT Pub. Date: Jan. 17, 2019

(65) Prior Publication Data
US 2020/0211745 A1 Jul. 2, 2020

(30) Foreign Application Priority Data

Jul. 11, 2017 (JP) .............................. JP2017-135165

(51) Int. Cl.
*G01R 31/08* (2020.01)
*H01F 7/18* (2006.01)
(Continued)

(52) U.S. Cl.
CPC ....... *H01F 7/1844* (2013.01); *G01R 19/0069* (2013.01); *G01R 31/08* (2013.01);
(Continued)

(58) Field of Classification Search
CPC ......... H01F 7/18; H01F 7/1844; G01R 31/08; G01R 19/0069; G01R 19/0023;
(Continued)

(56) References Cited

U.S. PATENT DOCUMENTS 5,585,701 A 12/1996 Kaida et al.
2004/0155662 A1* 8/2004 Graf .................. G01R 19/0092
324/522

(Continued)

FOREIGN PATENT DOCUMENTS

JP 7-113826 A 5/1995
JP 7-163177 A 6/1995
(Continued)

OTHER PUBLICATIONS

Japanese-language Office Action issued in Japanese Application No. 2019-529456 dated Sep. 8, 2020 with English translation (eight (8) pages).

(Continued)

*Primary Examiner* — Danny Nguyen
(74) *Attorney, Agent, or Firm* — Crowell & Moring LLP

(57) ABSTRACT

An object is to provide a new electronic control unit that can improve detection accuracy of a sense current even in a region where the current value of the sense current is small. Provided is a sense current detection unit including a plurality of sense transistors that have different current flow rates and that are connected to current output transistors controlling a current flowing in a coil load. The current in the sense current detection unit is input to an analog/digital converter, and the current value of the current flowing in the sense current detection unit is converted into a digital value. The current value of the current flowing in the sense current detection unit is increased through a combination or a selection of the plurality of sense transistors of the sense (Continued)

current detection unit in a region where the current value of the main current of the current output transistors is small compared to a region where the current value of the main current is large.

7 Claims, 6 Drawing Sheets

(51) Int. Cl.
 *G01R 19/00* (2006.01)
 *H01L 29/78* (2006.01)
 *H02H 9/08* (2006.01)
 *H02H 3/08* (2006.01)

(52) U.S. Cl.
 CPC ........... *H01F 7/18* (2013.01); *H01L 29/7833* (2013.01); *H02H 3/08* (2013.01); *H02H 9/08* (2013.01)

(58) Field of Classification Search
 CPC ........ H01L 29/7833; H02H 9/08; H02H 3/08; H02H 9/02; H03K 17/082; H03K 17/0822
 USPC ..................................... 361/86–87, 93.7–93.9
 See application file for complete search history.

(56) References Cited

U.S. PATENT DOCUMENTS

| 2005/0180084 A1* | 8/2005 | Rober | H01H 47/325 361/187 |
| 2009/0039869 A1 | 2/2009 | Williams | |
| 2009/0097178 A1* | 4/2009 | Krishnan | H03F 3/2173 361/86 |
| 2011/0115451 A1 | 5/2011 | Hashimoto et al. | |
| 2013/0057241 A1 | 3/2013 | Shuvalov | |
| 2014/0334051 A1 | 11/2014 | Yagyu et al. | |
| 2015/0115923 A1 | 4/2015 | Shao | |
| 2016/0233789 A1 | 8/2016 | Onishi | |
| 2017/0093390 A1 | 3/2017 | Tsurumaru et al. | |
| 2017/0294918 A1* | 10/2017 | Llling | H03M 1/124 |

FOREIGN PATENT DOCUMENTS

| JP | 9-49858 A | 2/1997 |
| JP | 11-83911 A | 3/1999 |
| JP | 2003-323145 A | 11/2003 |
| JP | 2004-177796 A | 6/2004 |
| JP | 2010-536032 A | 11/2010 |
| JP | 2011-109812 A | 6/2011 |
| JP | 2013-127709 A | 6/2013 |
| JP | 2013-531962 A | 8/2013 |
| JP | 2015-77010 A | 4/2015 |
| JP | 2017-63270 A | 3/2017 |
| WO | WO 2015/008461 A1 | 1/2015 |

OTHER PUBLICATIONS

Japanese language Office Action issued in Japanese Application No. 2019-529456 dated Feb. 2, 2021 with English translation (nine (9) pages).
International Search Report (PCT/ISA/210) issued in PCT Application No. PCT/JP2018/016085 dated Jul. 31, 2018 with English translation (four (4) pages).
Japanese-language Written Opinion (PCT/ISA/237) issued in PCT Application No. PCT/JP2018/016085 dated Jul. 31, 2018 (four (4) pages).

* cited by examiner

ELECTRONIC CONTROL UNIT

TECHNICAL FIELD

The present invention relates to an electronic control unit that electrically drives a coil load, and particularly to an electronic control unit that detects a current flowing through the coil load and applies feedback control to the current input to the coil load.

BACKGROUND ART

In a general industrial machine field, an automobile field, or the like, a mechanical system element or a fluid system element is driven by an electric actuator (for example, an electromagnetic solenoid, an electric motor, or the like). For example, an electromagnetic solenoid that controls hydraulic oil of an automatic transmission such as a CVT or a stepped transmission of an automobile, an electromagnetic solenoid that controls the hydraulic oil of the hydraulic variable valve mechanism that adjusts the opening/closing phase of an intake/exhaust valve of an internal combustion engine, or the like adjusts the flow rate of the hydraulic oil by driving the hydraulic oil regulating valve in accordance with the current value of the current flowing through the coil. And then, in these electromagnetic solenoids, the current value of the current flowing through the coil is controlled in the range of several tens of milliamperes to several amperes for driving the coil by using a current output transistor composed of a power transistor or the like such as a MOSFET, for example.

When such a current output transistor is used to control the current value of the current flowing through the coil of the electromagnetic solenoid, the current flowing through the coil is detected by using a sense transistor such as a MOSFET connected to the current output transistor, and the detected current is input to the control unit composed of a microcomputer or driver circuit for calculation of the gate control signal, and then the gate control signal from this control unit is input to the gate terminal of the current output transistor, thereby controlling the current value of the current flowing in the coil through the control of the on/off time ratio of the current output transistor.

Such a current control method is well known as disclosed in JP-2011-109812-A (Patent Document 1), for example.

PRIOR ART DOCUMENT

Patent Document

Patent Document 1: JP-2011-109812-A

SUMMARY OF THE INVENTION

Problems to be Solved by the Invention

As described above, an electromagnetic solenoid used in an automatic transmission or a hydraulic variable valve mechanism drives a hydraulic oil regulating valve corresponding to (proportional to, for example) the current value of the current flowing through the coil. When the current value of the current flowing through the coil fluctuates with respect to a set current value, there arises a problem that the driving amount of the hydraulic oil regulating valve fluctuates and the flow rate of the hydraulic oil also fluctuates. In order to cope with such a problem, it is preferable to control the current value of the current flowing through the coil so that the current value agrees with the set current value.

For this reason, conventionally, as described above, the current value of the current flowing through the coil is detected by the sense transistor, and the current value of the current flowing through the coil is increased when the detected current value is smaller than the set current value, and conversely when the detected current value is larger than the set current value, the current value of the current flowing through the coil is reduced to compensate for fluctuations in the current flowing through the coil.

Incidentally, when such current feedback control is executed, the current detected by the sense transistor (hereinafter referred to as the sense current) is an analog value, which is required to be converted into a digital value that can be processed by the microcomputer. Therefore, the sense current detected by the sense transistor is input to an analog/digital converter and converted into a digital value (quantization).

By the way, the current flowing through the current output transistor (hereinafter referred to as a main current) is increased or decreased in the range of several tens of milliamperes to several amperes according to the set current value. In addition, the sense current detected by the sense transistor is increased or decreased in the range of several tens of $\rho A$ to about 1 mA according to the increase or decrease of the main current and according to the "main/sense ratio" which is the ratio of the main current value to the sense current value.

Therefore, in the region where the main current value (or set current value) is small, the current value of the sense current is also small, and particularly in the region where the current value of the sense current is small, the analog-digital conversion quantization error is relatively large, and thus, there arises a new problem that the accuracy of the current feedback control is lowered. Although the quantization error can be reduced by increasing the number of bits of the analog/digital converter, increase in the number of bits increases the area of the analog/digital converter and also increases the read response time to cause a problem on the control, and thus increase in the number of bits is not a reasonable solution.

An object of the present invention is to provide a new electronic control unit capable of improving the detection accuracy of the sense current even in a region where the current value of the sense current is small. In the above description and the description of the embodiment, although an electromagnetic solenoid is described, the present invention is not limited to this, and can also be applied to other electric actuators such as electric motors in which a current flowing through the coil load is variably adjusted within a predetermined operating range.

Means for Solving the Problems

The feature of the present invention is providing a sense current detection unit including a plurality of sense transistors that have different current flow rates and that are connected to a current output transistor controlling a current flowing in a coil load. A sense current of the sense current detection unit is input to an analog/digital converter to convert the current value of the current flowing through the sense current detection unit into a digital value. The current value of the sense current flowing through the sense current detection unit is increased through a combination or a selection of the plurality of sense transistors of the sense current detection unit in a region where the current value of the main current of the current output transistor is small compared to a region where the current value of the main current is large.

Effects of the Invention

According to the present invention, since the current value of the sense current input to the analog/digital converter is increased in the region where the current value of the main current of the current output transistor is small compared to the region where the current value of the main current is large, the quantization error of the analog-digital conversion can be reduced so as to improve the detection accuracy of the sense current.

MODES FOR CARRYING OUT THE INVENTION

Hereinafter, although embodiments of the present invention will be described in detail with reference to the drawings, the present invention is not limited to the following embodiments, and various modifications and application examples are also included in the range of the technical concept of the present invention.

First Embodiment

Figure 1:
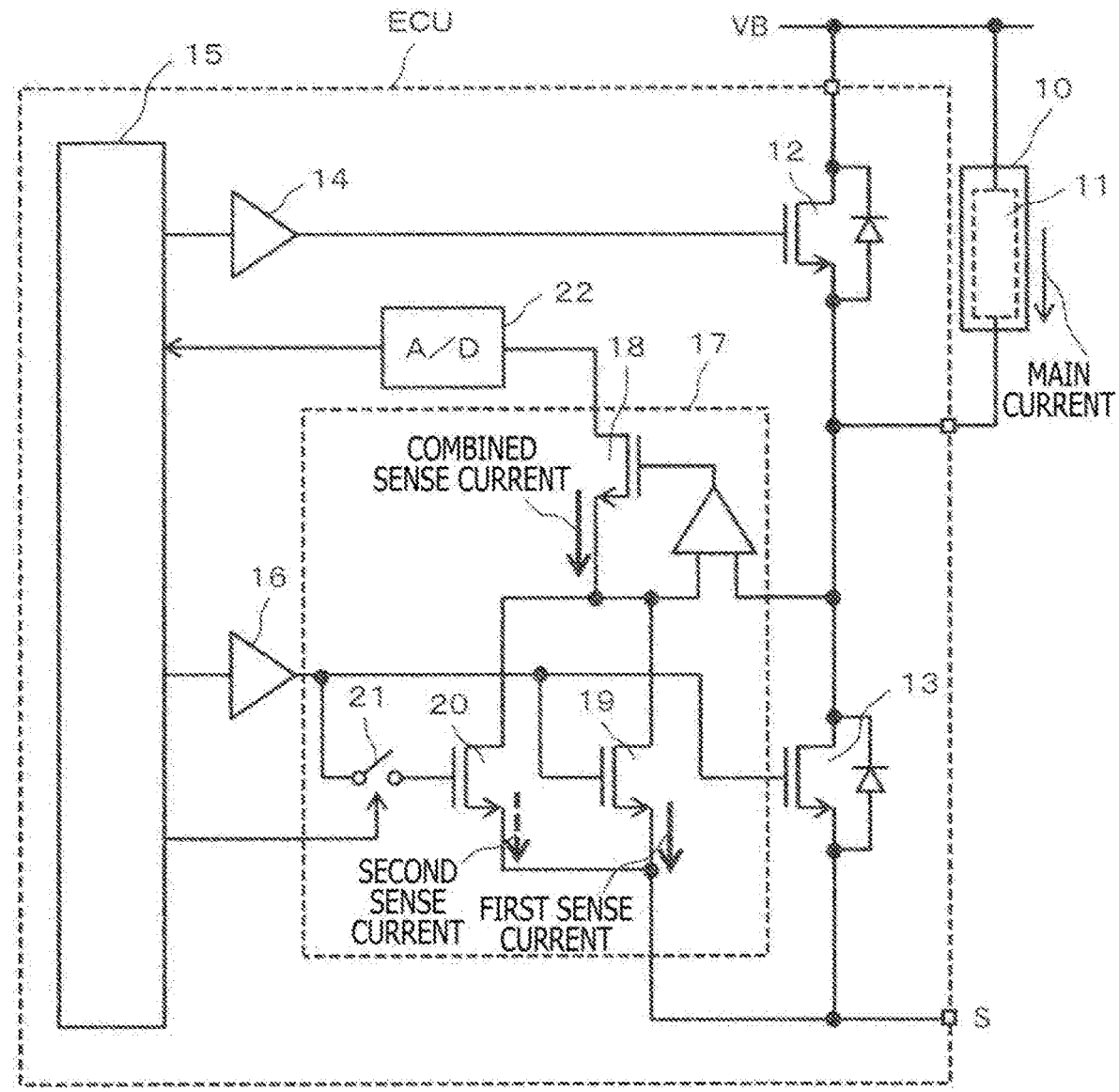
FIG. 1 is a configuration diagram depicting a configuration of a main load drive circuit of an electronic control unit according to a first embodiment of the present invention.

FIG. 1 depicts a configuration of an electronic control unit (ECU) including a load drive circuit configured as a low-side load drive circuit used in an automatic transmission of an internal combustion engine. This electronic control unit (ECU) is used for controlling an electromagnetic solenoid that drives a hydraulic oil regulating valve that controls the flow rate of hydraulic oil in the automatic transmission.

In FIG. 1, an electromagnetic solenoid 10 is disposed in a hydraulic oil passage of an automatic transmission, and a hydraulic oil regulating valve is built therein. The electromagnetic solenoid 10 is provided with a coil 11 therein, and the position of the hydraulic oil regulating valve is adjusted in accordance with the value of the current flowing through the coil 11. One end of the coil 11 is connected to a battery, and the other end of the coil is connected to a midpoint between a high-side current output transistor 12 and a low-side current output transistor 13. The high-side current output transistor 12 and the low-side current output transistor 13 are arranged in series between the power source and the ground, and function as current output transistors.

The high-side current output transistor 12 is connected to a control circuit 15 via a pre-buffer 14, and similarly, the low-side current output transistor 13 is connected to the control circuit 15 via a pre-buffer 16. The control circuit 15 is composed of a microcomputer, an input/output circuit, and the like, and each gate control signal of the high-side current output transistor 12 and the low-side current output transistor 13 is made by calculation of a program written in a ROM built in the microcomputer.

Each of these gate control signals is used to complementarily turn on/off the high-side current output transistor 12 and the low-side current output transistor 13, and the current flowing through the coil 11 of the electromagnetic solenoid 10 is controlled by the on/off time ratio, namely so-called PWM control. This current is the main current described above and corresponds to the set current value set by the microcomputer, and is controlled in the range of several tens of milliamperes to several amperes in the present embodiment.

A sense current detection unit 17 according to the present embodiment is connected to an intermediate point between the high-side current output transistor 12 and the low-side current output transistor 13, and includes a control transistor 18, first sense transistor 19 and second sense transistor 20. These transistors 18, 19, and 20 are connected in parallel with the low-side current output transistor 13.

The gate side of the control transistor 18 is connected to an intermediate point between the high-side current output transistor 12 and the low-side current output transistor 13. The source side of the control transistor 18 is connected to the drain side of the first sense transistor 19 and the drain side of the second sense transistor 20. Further, the source side of the first sense transistor 19 and the source side of the second sense transistor 20 are both grounded. Accordingly, the first sense transistor 19 and the second sense transistor 20 are connected in parallel. Therefore, a configuration is made so that the current from the control transistor 18 flows through the first sense transistor 19 and the second sense transistor 20.

Intermediate points between the gate side of the low-side current output transistor 13 and the pre-buffer 16 are connected to the gate side of the first sense transistor 19 and the gate side of the second sense transistor 20. However, a switch element 21 is interposed between the gate side of the second sense transistor 20 and an intermediate point between the gate side of the low-side current output transistor 13 and the pre-buffer 16. A semiconductor switch such as a transistor can be used as the switch element 21.

Therefore, while the current output transistor composed of the high-side current output transistor 12 and the low-side current output transistor 13 is operating, since a gate control signal is always input to the gate side of the first sense transistor 19, the current from the control transistor 18 always flows to the first sense transistor 19 as the first sense current. This configuration is the same as the configuration of the conventional sense transistor, and in the present embodiment, the current value of the first sense current is detected in a "first current value region," which is a region where the current value of the main current of the current output transistor is large.

On the other hand, since the switch element 21 is disposed on the gate side of the second sense transistor 20, when the switch element 21 is "OFF," the gate side of the second sense transistor 20 and an intermediate point between the gate side of the low-side current output transistor 13 and the pre-buffer 16 is electrically cut off. For this reason, the second sense transistor 20 does not operate (non-operation), and no current flows. This state corresponds to the above-described first current value region.

On the other hand, when the switch element 21 is "ON," since the gate side of the second sense transistor 20 and an intermediate point of the gate side of the low-side current output transistor 13 and the pre-buffer 16 are electrically connected, a gate control signal is input to the gate side of the second sense transistor 20. For this reason, the second sense transistor 20 operates and the second sense current additionally flows. In this way, the first sense transistor 19 and the second sense transistor 20 are combined and operated.

This state is a "second current value region" where the current value of the main current is smaller than that in the "first current value region" where the current value of the main current is large, and the current value of the sense current at this time is larger than the sense current value of the "first current value region." As described above, the sense current value in the "second current value region" is a combined sense current value obtained by adding the first sense current value of current flowing through the first sense transistor 19 to the second sense current value of current flowing through the second sense transistor 20.

Here, a combined current value composed of the first sense current (denoted as a combined current value for convenience) and a combined sense current value obtained by adding the first sense current to the second sense current are each converted into a digital value by an analog/digital converter 22. In this case, the analog/digital converter 22 converts the combined sense voltage value corresponding to the combined sense current value into a digital value with reference to a reference voltage value corresponding to a reference current value (not depicted), and the current value and the voltage value correspond to each other.

The current value that demarcates (separates) the first current value region from the second current value region can be freely determined, but in particular, it is desirable to determine the current value so that the influence of the quantization error of the "first current value region" by the analog/digital converter 22 does not become a problem.

As described above, while the current output transistor is in operation, the current from the control transistor 18 always flows as the first sense current to the first sense transistor 19 and is the same as the conventional sense transistor. Therefore, in the case of the first sense current by using only the first sense transistor 19, the quantization error of the analog-digital conversion becomes relatively large in the region where the main current value (or set current value) is small, in other words, in the region where the current value of the sense current is small, and the problem arises that the accuracy of the current feedback control is reduced.

Regarding this in the present embodiment, in the region where the current value of the main current of the current output transistor is large, since the sense current value is also large, the quantization error of analog-digital conversion is not a problem particularly, and thus only the first sense transistor 19 of the sense current detection unit 17 is operated to detect the sense current.

On the other hand, in the "second current value region" where the current value of the main current of the current output transistor is small compared to the "first current value region" where the current value of the main current is large, since the sense current value is small and the quantization error of analog-digital conversion becomes a problem, the first sense transistor 19 and the second sense transistor 20 of the sense current detection unit 17 are operated together to increase the current value of the combined sense current flowing in the sense current detection unit 17.

Thus, in the "second current value region" where the current value of the main current is small, since the current value of the sense current input to the analog/digital converter 22 is increased, the quantization error of the analog-digital conversion is reduced and the detection accuracy of the sense current can be improved.

Here, in order to improve the detection accuracy in the "second current value region" using only the conventional first sense transistor, if the current flowing through the first sense transistor is increased, the current value in the "first current value region" becomes excessive. This causes a problem that the conversion range of the analog/digital converter 22 must be enlarged.

Figure 2:
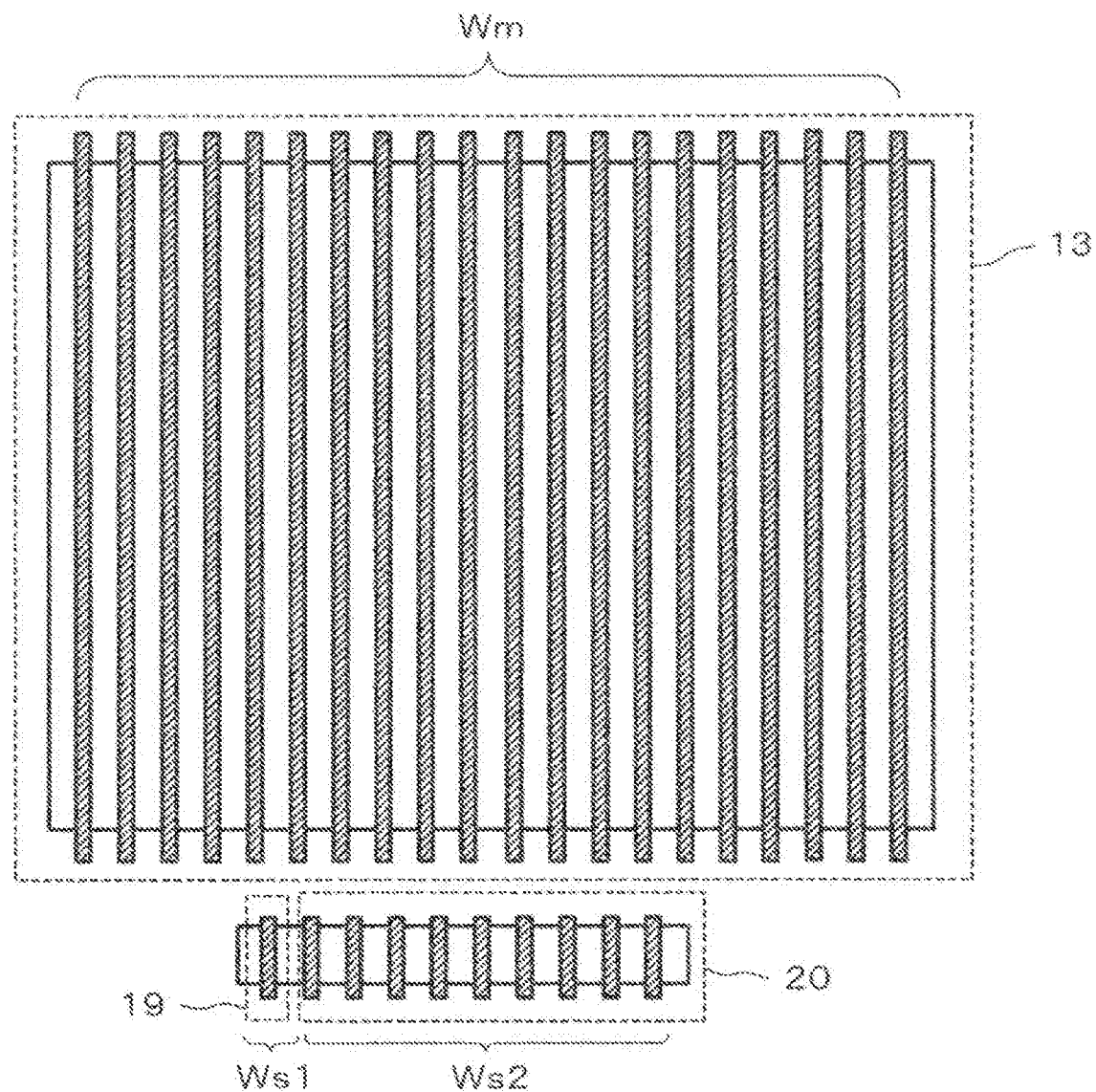
FIG. 2 is an explanatory diagram for illustrating the layout and gate widths of a low-side current output transistor and a plurality of sense transistors depicted in FIG. 1.

Incidentally, as depicted in FIG. 2, a current output transistor such as the low-side current output transistor 13 is generally composed of a MOSFET, and a MOSFET having a large total gate width Wm is used. On the other hand, the sense transistor is also composed of a MOSFET, and a MOSFET having a small total gate width Ws is used. A MOSFET having a larger total gate width can pass more current than a MOSFET having a smaller total gate width. Thus, the total gate width of the MOSFET and the current value that can be passed through the MOSFET (hereinafter sometimes referred to as current flow rate for convenience) are closely correlated.

In the present embodiment, the gate width Ws2 of the second sense transistor 20 is set larger than the gate width Ws1 of the first sense transistor 19, and under the same conditions, the second sense transistor 20 can pass a current of a larger flow rate than the first sense transistor 19.

Here, when the total gate width of the low-side current output transistor 13 is defined as Wm, the total gate width of the first sense transistor 19 as Ws1, and the total gate width of the second sense transistor 20 as Ws2, the "main/sense ratio" that is the ratio of the main current to the sense current is "Wm/Ws1" in the "first current value region" and is "Wm/(Ws1+Ws2)" in the "second current value region." Therefore, the "second current value region" has a smaller main/sense ratio.

For example, if "Wm/Ws1=1000" is set in the "first current value region" and "Wm/(Ws1+Ws2)=100" is set in the "second current value region," by turning the switch element 21 "ON" when the sense current value becomes smaller than the maximum value by one order of magnitude, the sense current value becomes ten times as large as in the case where the switch element 21 is "OFF," and the current detection error of the analog/digital converter 22 can be reduced to $\frac{1}{10}$. In other words, the minimum usable current value can be reduced to $\frac{1}{10}$ with the same current detection accuracy.

In the present embodiment, the value of the main/sense ratio associated with the switching between "ON" and "OFF" of the switch element 21 is set to about ten times, but setting within a range of 6 to 20 times is adequate within the practical range. The current value of the main current can be obtained by multiplying the current value of the sense current by the main/sense ratio.

Here, since the current flowing through the second sense transistor 20 is added in the "second current value region," the analog/digital converter 22 applies analog-digital conversion to the current including the added amount. Therefore, if this added amount is used as it is, a state in which the current value of the main current is large is erroneously detected, and thus reconversion is necessary.

Therefore, in the present embodiment, in order to obtain the main current value of the low-side current output transistor 13 from the sense current value read by the analog/digital converter 22, reconversion is performed to correct the read sense current value by using the ratio of the current values of the sense transistors. For this reason, the current value ratio (total gate width ratio) of the sense transistors is stored in the ROM area of the microcomputer, and is used in the calculation expression of the program for reconversion.

Further, when being switched between the "first current value region" and the "second current value region," the switch element 21 can be switched by comparing the sense current value with a predetermined current threshold value. The current threshold value when switching from the "first current value region" (=switch element is OFF) to the "second current value region" (=switch element is ON) is set to be lower than the current threshold value when switching from the "second current value region" (=switch element is ON) to the "first current value region" (=switch element is OFF) so as to stabilize the switching operation of the switch element 21.

Although the above-described example is an example using a comparator, the switch element 21 can be controlled by a set current value. For example, a program that sets the switch element 21 to "OFF" when the set current value is set to the "first current value region" by the control circuit 15, and that sets the switch element 21 to "ON" when the set current value is set to the "second current value region" can also be stored in the ROM of the microcomputer and the switch element 21 can be controlled in accordance with this program.

In any case, it suffices if the main current is measured by using the sense current flowing through the first sense transistor 19 in the "first current value setting region," and the main current can be measured by using the sense current obtained by adding the sense currents flowing through the first sense transistor 19 and the second sense transistor 20 to each other in the "second current value setting region."

Figure 3:
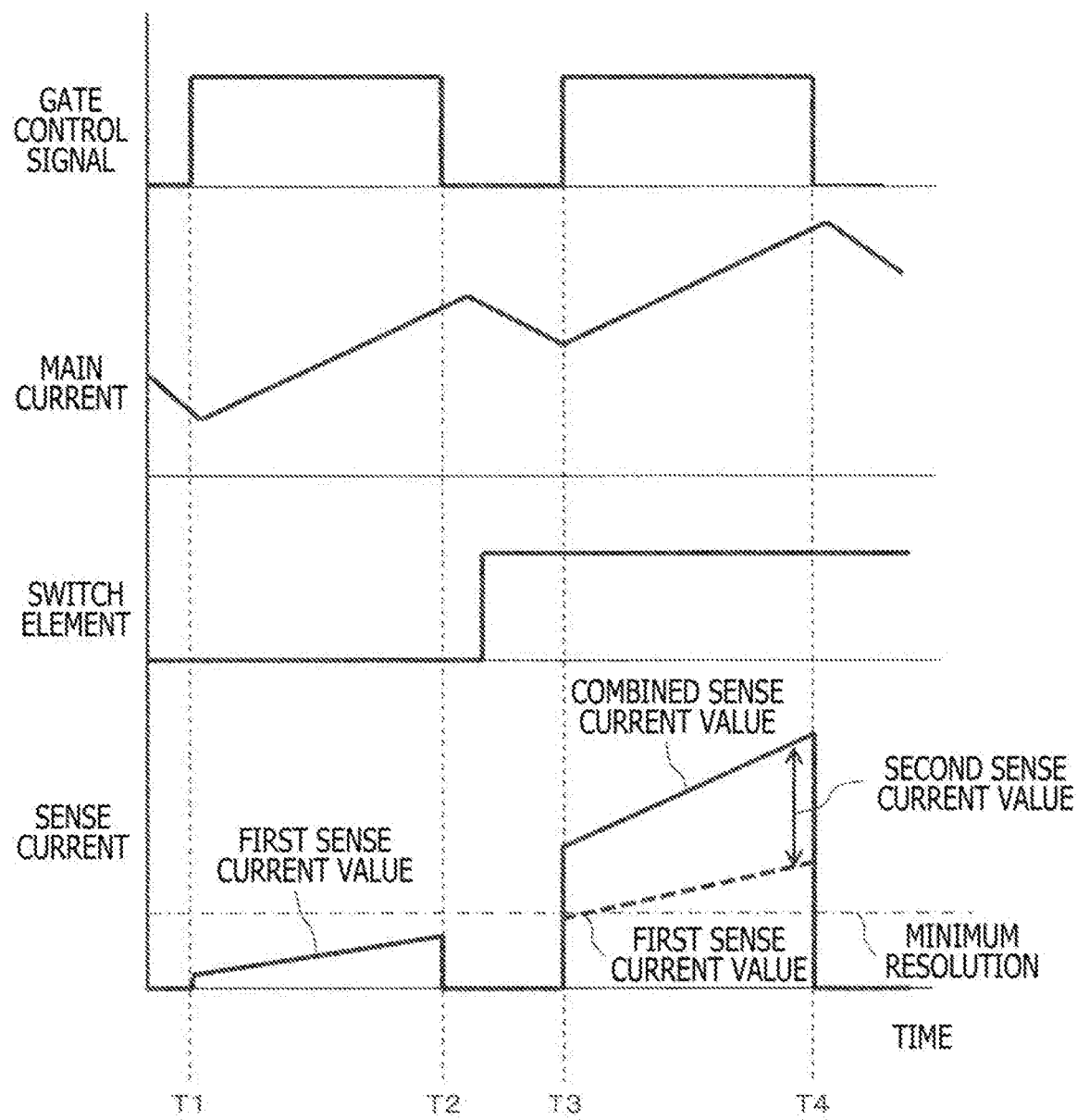
FIG. 3 is an operation explanatory diagram for illustrating the operation of the load drive circuit depicted in FIG. 1.

FIG. 3 depicts changes in the gate control signal at an intermediate point between the gate side of the low-side current output transistor 13 and the pre-buffer 16, changes in the main current flowing through the low-side current output transistor 13, changes in the switch element 21, and changes in the sense current in the "second current value region" (=region where the current value of the main current is small).

Now, the gate control signal changes so as to rise at time T1, then fall at time T2, further rise at time T3, and then fall at time T4. This gate signal is supplied to the low-side current output transistor 13, and accordingly, the main current increases at the time from time T1 to time T2, decreases from time T2 to time T3, and increases from time T3 to time t4 and then decreases after time T4.

The gate control signal is supplied to the first sense transistor 19 and the second sense transistor 20, but the switch element 21 is "OFF" until time T2. Therefore, at this time, the sense current value of the first sense transistor 19 does not reach the current value exceeding the minimum resolution of the analog/digital converter 22. For this reason, there is a fear that the detection accuracy of the sense current will reduce.

Thus, the switch element 21 is turned "ON" at a time between time T2 and time T3, thereby additionally supplying the sense current also to the second sense transistor 20 after time T3. Therefore, the sense current at the time from time T3 to time T4 is a combined current of the sense current (depicted by a broken line) flowing through the first sense transistor 19 and the sense current flowing through the second sense transistor 20, and makes it possible to perform excellent analog-digital conversion by the analog/digital converter 22.

Here, the switch element 21 is controlled to be switched during a period (between time T2 and time T3) in which the gate control signal is input to neither the first sense transistor 19 nor the second sense transistor 20. As a result, irregular fluctuations in the sense current can be suppressed.

In the above-described embodiment, although two sense transistors are used as the sense transistors connected in parallel, it is also possible to provide more sense transistors and to increase the number of sense transistors which start operations step by step as the main current decreases. In the present embodiment, the transistors constituting the sense current detection unit are mounted on a common semiconductor substrate. Further, the sense current detection unit and the current output transistors are mounted on a common module substrate.

As described above, in the present embodiment, a sense current detection unit including a plurality of sense transistors connected in parallel to each other and connected to a current output transistor that controls a current flowing in the coil load is provided, and the current of the sense current detection unit is input to an analog/digital converter to convert the value of the current flowing through the sense current detection unit into a digital value, and further a plurality of sense transistors are operated in combination in a region where the current value of the main current of the current output transistor is smaller than that in the region where the current value of the main current is large, so that the current value of the sense current is increased.

According to this, since the current value of the sense current input to the analog/digital converter is increased in the "second current value region" where the current value of the main current is small, the quantization error of the analog-digital conversion is reduced, and thus the detection accuracy of the sense current can be improved.

Second Embodiment

Next, a second embodiment of the present invention will be described. The first embodiment is configured such that two sense transistors are connected in parallel to each other, and one sense transistor is operated in the "first current value region," and the two sense transistors connected in parallel are operated in combination in the "second current value region."

In contrast, the second embodiment is different from the first embodiment in that the second embodiment is configured to selectively switching the two sensing transistors to operate such that the first sense transistor having a small current flow amount (=total gate width) is operated by a first switch element in the "first current value region," and the second sense transistor having a current flow amount (=total gate width) larger than the current flow amount (=total gate width) of the first sense transistor is operated by a second switch element in the "second current value region."

Hereinafter, the second embodiment will be described in detail with reference to FIGS. 4 to 6. Note that the configuration of the electronic control unit (ECU) depicted in FIG. 4 is basically the same as that of the first embodiment depicted in FIG. 1, and thus the description of duplicate components is omitted.

Figure 4:
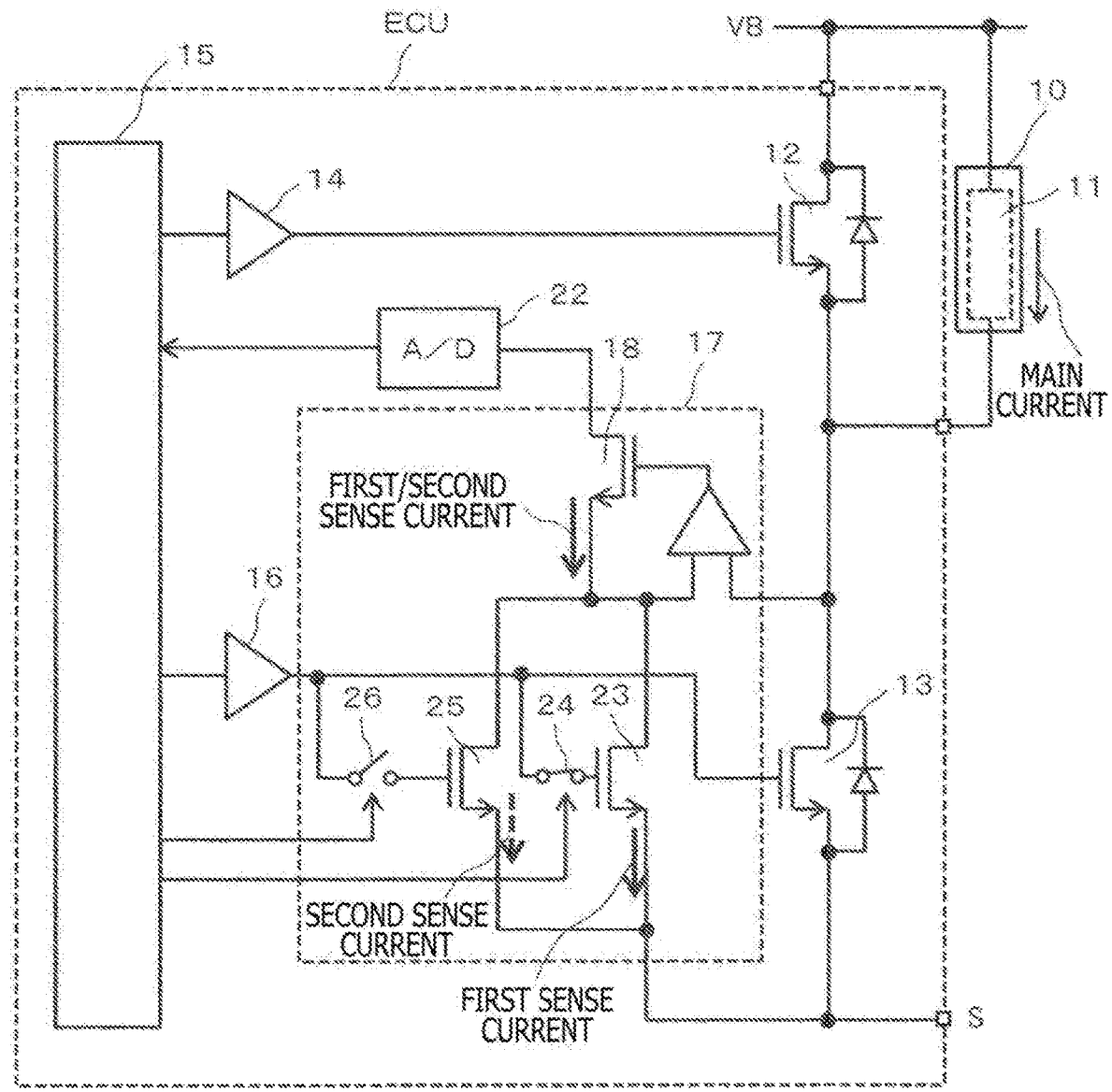
FIG. 4 is a configuration diagram depicting a configuration of a main load drive circuit of an electronic control unit according to a second embodiment of the present invention.

As depicted in FIG. 4, the source side of the control transistor 18 is connected to the drain side of a first sense transistor 23 and the drain side of a second sense transistor 25. Further, the source side of the first sense transistor 23 and the source side of the second sense transistor 25 are both grounded. Therefore, the first sense transistor 23 and the second sense transistor 25 are connected in parallel to each other. For this reason, the current from the control transistor 18 is allowed to selectively flow to the first sense transistor 23 and the second sense transistor 25 by switch elements described later.

Intermediate points between the gate side of the low-side current output transistor 13 and the pre-buffer 16 are connected to the gate side of the first sense transistor 23 and the gate side of the second sense transistor 25. Further, a first switch element 24 is interposed between the gate side of the first sense transistor 23 and an intermediate point between the gate side of the low-side current output transistor 13 and the pre-buffer 16. Similarly, a second switch element 26 is interposed between the gate side of the second sense transistor 25 and an intermediate point between the gate side of the low-side current output transistor 13 and the pre-buffer 16.

Semiconductor switches such as transistors can be used for the switch elements 24 and 26. The switch elements 24 and 26 are controlled by the control circuit 15 and operate complementarily. In other words, the second switch element 26 is "OFF" when the first switch element 24 is "ON," and conversely, the second switch element 26 is "ON" when the first switch element 24 is "OFF."

Then, the control circuit 15 sets the first switch element 24 to "ON" and the second switch element 26 to "OFF" in the above-mentioned "first current value region" (=region where the current value of the main current is large). Similarly, in the above-mentioned "second current value region" (=region where the current value of the main current is small), the second switch element 26 is set to "ON" and the first switch element 24 to "OFF."

Accordingly, when the first switch element 24 is set to "OFF" (in the "second current value region"), the gate side of the first sense transistor 23 is electrically disconnected from an intermediate point between the gate side of the low-side current output transistor 13 and the pre-buffer 16. Therefore, the first sense transistor 23 does not operate and no current flows. On the other hand, when the first switch element 24 is set to "ON" (in the "first current value region"), since the gate side of the first sense transistor 23 is electrically connected to the intermediate point between the gate side of the low-side current output transistor 13 and the pre-buffer 16, a gate control signal is input to the gate side of the first sense transistor 23. Thus, the first sense transistor 23 operates and the first sense current starts to flow.

Similarly, when the second switch element 26 is set to "OFF" (in the "first current value region"), the gate side of the second sense transistor 25 is electrically disconnected from an intermediate point between the gate side of the low-side current output transistor 13 and the pre-buffer 16. Therefore, the second sense transistor 25 does not operate and no current flows. On the other hand, when the second switch element 26 is set to "ON" (in the "second current value region"), since the gate side of the second sense transistor 23 is electrically connected to the intermediate point between the gate side of the low-side current output transistor 13 and the pre-buffer 16, a gate control signal is input to the gate side of the second sense transistor 25. For this reason, the second sense transistor 25 operates and the second sense current starts to flow.

Figure 5:
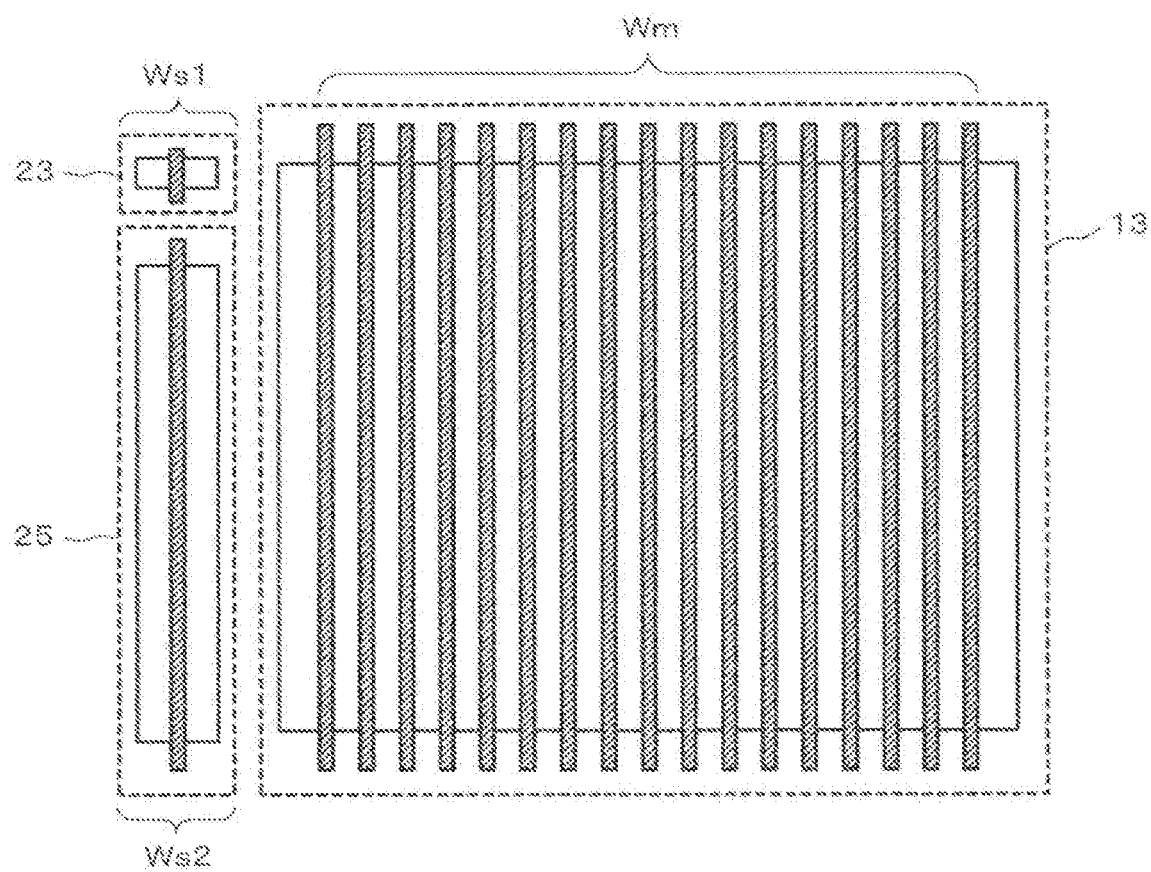
FIG. 5 is an explanatory diagram for illustrating the layout and gate widths of a low-side current output transistor and a plurality of sense transistors depicted in FIG. 4.

Here, as depicted in FIG. 5, the total gate width Ws2 of the second sense transistor 25 is set to be larger than the total gate width Ws1 of the first sense transistor 23, and the second sense transistor 25 can pass a current of a larger current flow rate than the first sense transistor 23 under the same conditions.

As in the first embodiment, when the total gate width of the low-side current output transistor 13 is defined as Wm, the total gate width of the first sense transistor 23 as Ws1, and the total gate width of the second sense transistor 25 as Ws2, the "main/sense ratio" is "Wm/Ws1" in the "first current value region" and "Wm/Ws2" in the "second current value region." Therefore, the "second current value region" has a smaller main/sense ratio.

When it is assumed that "Wm/Ws1=1000" is set in the "first current value region" and "Wm/Ws2=100" is set in the "second current value region," by turning the second switch element 26 "ON" and the first switch element 24 "OFF" when the sense current value becomes smaller than the maximum value by one order of magnitude, for example, the sense current value becomes ten times as large as in the case where the second switch element 26 is "OFF" and the first switch element 24 is "ON," and thus, the current detection error of the analog/digital converter 22 can be reduced to $\frac{1}{10}$.

In the second embodiment as well, since the current flowing through the second sense transistor 25 is increased in the "second current value region," the analog/digital converter 22 applies analog-digital conversion to the current including this increase. Accordingly, in order to obtain the main current value of the low-side current output transistor 13 from the sense current value read by the analog/digital converter 22 as in the first embodiment, reconversion is performed to correct the read sense current value by using the ratio of the current values of the sense transistors. For this reason, the current value ratio (total gate width ratio) of the sense transistors is stored in the ROM area of the microcomputer, and is used in the calculation expression of the program for reconversion.

Further, when the switch elements 24 and 26 are switched complementarily between the "first current value region" and the "second current value region," the sense current value can be switched by being compared with a predetermined current threshold value as in the first embodiment. Furthermore, the switch elements 24 and 26 can be complementarily controlled by the set current value. For example, a program for setting the first switch element 24 to "ON" and the second switch element 26 to "OFF" when the set current value is set to the "first current value region" by the control circuit 15, and setting the second switch element 26 to "ON" and the first switch element 24 to "OFF" when the set current value is set to the "second current value region" is stored in the ROM of the microcomputer, and the switch element 21 can be controlled according to this program.

Figure 6:
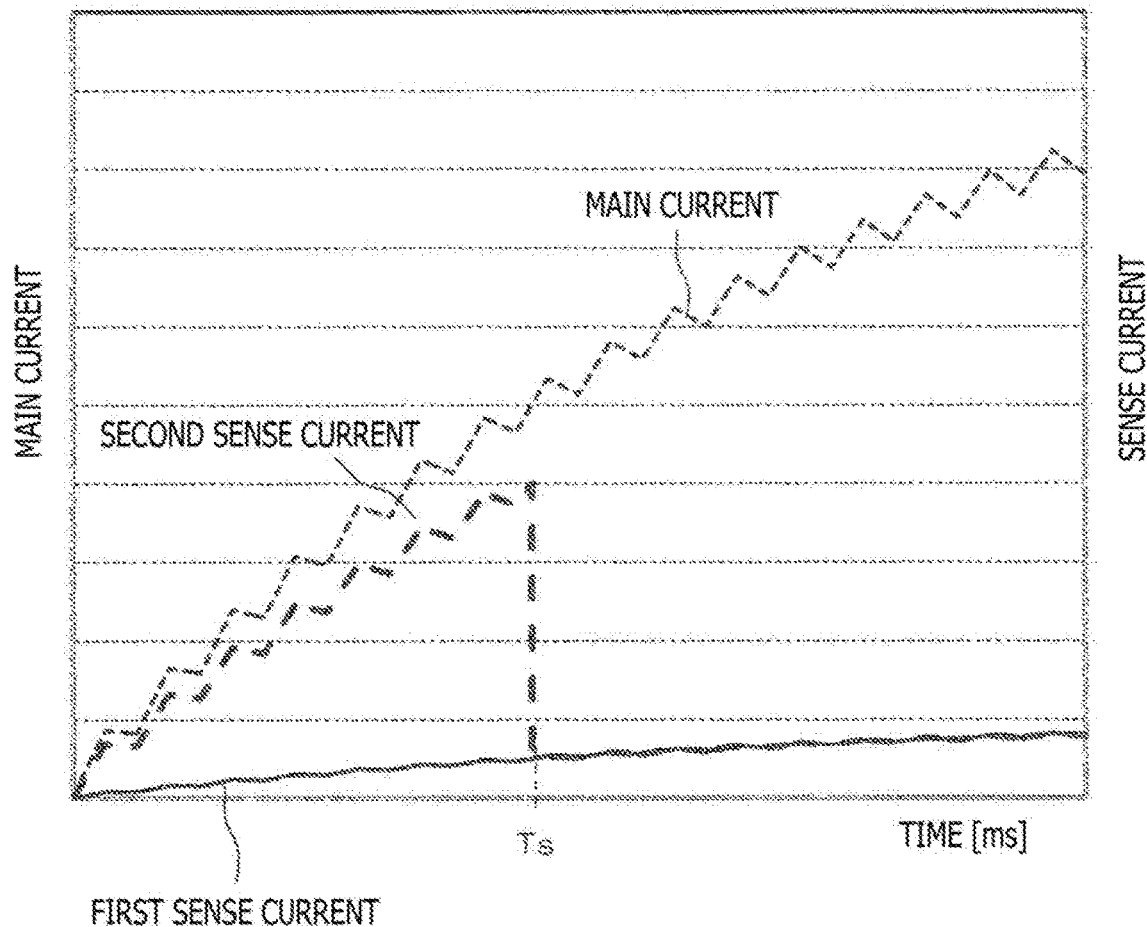
FIG. 6 is an operation explanatory diagram for illustrating the operation of the load drive circuit depicted in FIG. 4.

FIG. 6 depicts a change state of the sensor current caused by switching between the first sense transistor 23 and the second sense transistor 25.

In FIG. 6, when the sense current is lower than a predetermined current threshold, the control circuit 15 changes the second switch element 26 to "ON" and the first switch element 24 to "OFF." In this state, the second sense transistor 25 operates and the first sense transistor 23 does not operate so that the sense current becomes the second sense current.

On the other hand, when the sense current becomes higher than a predetermined current threshold at time Ts, the control circuit 15 turns the first switch element 24 "ON" and the second switch element 26 "OFF." In this state, the first sense transistor 25 operates and the second sense transistor 23 does not operate so that the sense current becomes the first sense current. The switching of the switch elements 24 and 26 is executed when no gate control signal is input thereto as in the first embodiment.

As described above, the present embodiment is configured such that there is provided a sense current detection unit which is composed of a plurality of sense transistors having different current flow rates and connected in parallel to each other and which is connected to a current output transistor that controls a current flowing in a coil load, and the current of the sense current detection unit is input to an analog/digital converter and the value of the current flowing through the sense current detection unit is converted into a digital value, and then a sense transistor having a small current flow rate is used in the "first current value region" where the current value of the main current of the current output transistor is large and a sense transistor having a large current flow rate is switched to start operation in the "second current value region" where the current value of the main current is small, thereby increasing the current value of the sense current in the "second current value region."

According to this configuration, since the current value of the sense current input to the analog/digital converter is increased in the "second current value region" where the current value of the main current is small, the quantization error of the analog-digital conversion is reduced, and thus the detection accuracy of the sense current can be improved.

In addition, the present invention is not limited to above-described embodiments, and various modifications are included. For example, the above-described embodiments have been described in detail for easy understanding of the present invention, and are not necessarily limited to those having all the described configurations. In addition, a part of the configuration of a certain embodiment can be replaced with the configuration of another embodiment, and the configuration of another embodiment can be added to the configuration of a certain embodiment. Further, addition of other configurations, deletion, and replacement for a part of the configuration of each embodiment can be carried out.

DESCRIPTION OF REFERENCE CHARACTERS

ECU: Electronic control unit
10: Electromagnetic solenoid
11: Coil
12: High-side main transistor
13: Low-side main transistor
14: Pre-buffer
15: Control circuit
16: Pre-buffer
17: Sense current detection unit
18: Control transistor
19: First sense transistor
20: Second sense transistor
21: Switch element
22: Analog/digital converter
23: First sense transistor
24: First switch element
25: Second sense transistor
26: Second switch element

The invention claimed is:
1. An electronic control unit comprising:
a sense current detection unit including a plurality of sense transistors that have different current flow rates and that are connected to a current output transistor that controls a current flowing in a coil load,
a sense current of the sense current detection unit being input to an analog/digital converter to convert a current value of the sense current flowing through the sense current detection unit into a digital value,
the sense current detection unit increasing the current value of the sense current flowing through the sense current detection unit through a combination or a selection of the plurality of sense transistors in a second region where a current value of a main current of the current output transistor is small compared to a first region where the current value of the main current is large, wherein
the plurality of sense transistors include at least a first sense transistor and a second sense transistor, and a current flow rate of the second sense transistor is set larger than a current flow rate of the first sense transistor,
in the first region where the current value of the main current is large, a current value of a sense current flowing through the first sense transistor is input to the analog/digital converter to convert the current value into a digital value,
in the second region where the current value of the main current is small, a current value of a combined sense current flowing through the first sense transistor and the second sense transistor is input to the analog/digital converter to convert the current value into a digital value, and
the current output transistor, the first sense transistor, and the second sense transistor are formed of MOSFETs, and current flow rates of the current output transistor, the first sense transistor, and the second sense transistor are each determined by a total gate width of each of the MOSFETs.

2. The electronic control unit according to claim 1, wherein
the plurality of sense transistors include at least a first sense transistor and a second sense transistor, and a current flow rate of the second sense transistor is set larger than a current flow rate of the first sense transistor,
in the first region where the current value of the main current is large, the first sense transistor is selected for inputting a current value of a sense current flowing through the first sense transistor to the analog/digital converter to convert the current value into a digital value, and
in the second region where the current value of the main current is small, the second sense transistor is selected for inputting a current value of a sense current flowing through the second sense transistor to the analog/digital converter to convert the current value into a digital value.

3. The electronic control unit according to claim 1, wherein
a gate of the first sense transistor is supplied with a same gate control signal as a gate control signal of the current output transistor,
the same gate control signal as the gate control signal of the current output transistor is input to a gate of the second sense transistor via a switch element, and
in the second region where the current value of the main current is small, the switch element is closed such that the same gate control signal as the gate control signal of the current output transistor is input to the gate of the second sense transistor.

4. The electronic control unit according to claim 3, wherein,
  switching of the switch element is executed in a period in which no gate control signal is input to the gate of the second sense transistor.

5. An electronic control unit comprising:
  a sense current detection unit including a plurality of sense transistors that have different current flow rates and that are connected to a current output transistor that controls a current flowing in a coil load,
  a sense current of the sense current detection unit being input to an analog/digital converter to convert a current value of the sense current flowing through the sense current detection unit into a digital value,
  the sense current detection unit increasing the current value of the sense current flowing through the sense current detection unit through a combination or a selection of the plurality of sense transistors in a second region where a current value of a main current of the current output transistor is small compared to a first region where the current value of the main current is large;
  the plurality of sense transistors includes at least a first sense transistor and a second sense transistor, and a current flow rate of the second sense transistor is set larger than a current flow rate of the first sense transistor,
  in the first region where the current value of the main current is large, the first sense transistor is selected for inputting a current value of a sense current flowing through the first sense transistor to the analog/digital converter to convert the current value into a digital value,
  in the second region where the current value of the main current is small, the second sense transistor is selected for inputting a current value of a sense current flowing through the second sense transistor to the analog/digital converter to convert the current value into a digital value; wherein
  a same gate control signal as a gate control signal of the current output transistor is input to a gate of the first sense transistor via a first switch element,
  the same gate control signal as the gate control signal of the current output transistor is input to a gate of the second sense transistor via a second switch element,
  in the first region where the current value of the main current is large, the first switch element is closed while the second switch element being opened such that the same gate control signal as the gate control signal of the current output transistor is input to the gate of the first sense transistor, and
  in the second region where the current value of the main current is small, the second switch element is closed while the first switch element being opened such that the same gate control signal as the gate control signal of the current output transistor is input to the gate of the second sense transistor.

6. The electronic control unit according to claim 5, wherein
  switching of each of the first switch element and the second switch element is executed in a period in which the gate control signal is input to neither the gate of the first sense transistor nor the gate of the second sense transistor.

7. The electronic control unit according to claim 1, wherein
  switching between the first region where the current value of the main current is large and the second region where the current value of the main current is small is performed based on whether the sense current flowing through the sense current detection unit exceeds a predetermined current threshold or based on a set current value that sets the main current flowing through the current output transistor.

\* \* \* \* \*